(12) United States Patent
Chapin et al.

(10) Patent No.: US 6,968,763 B2
(45) Date of Patent: Nov. 29, 2005

(54) ORIENTING AND STACKING PARTS

(75) Inventors: Fletcher L. Chapin, Maine, NY (US); John E. Kozol, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 10/043,662

(22) Filed: Jan. 9, 2002

(65) Prior Publication Data

US 2003/0126834 A1 Jul. 10, 2003

(51) Int. Cl.[7] .............................. B26D 7/06; B65B 39/00
(52) U.S. Cl. ................................ 83/164; 83/165; 83/166; 53/255
(58) Field of Search ........................... 83/164, 165, 166, 83/97, 85, 906; 53/255; 220/675, 672, 673, 908.3, 502, 576, 908; 193/44, 45, 47; 198/406; 312/283, 290

(56) References Cited

U.S. PATENT DOCUMENTS

| | | | | |
|---|---|---|---|---|
| 1,109,489 A | * | 9/1914 | Vickery ........................ | 83/165 |
| 1,450,945 A | | 4/1923 | Furber | |
| 1,492,112 A | * | 4/1924 | Watrous ....................... | 193/47 |
| 1,923,937 A | * | 8/1933 | Kruse ........................... | 83/254 |
| 2,461,290 A | * | 2/1949 | Maynard et al. .............. | 193/47 |
| 2,561,925 A | * | 7/1951 | Jakubik ........................ | 198/560 |
| 2,578,223 A | * | 12/1951 | Brunner ....................... | 193/45 |
| 2,690,802 A | * | 10/1954 | Russell ......................... | 83/97 |
| 2,840,222 A | * | 6/1958 | Palmer ......................... | 193/44 |
| 2,981,394 A | * | 4/1961 | Stecher ......................... | 193/47 |
| 3,039,343 A | * | 6/1962 | Richards ....................... | 83/165 |
| 3,358,538 A | * | 12/1967 | Maceyka ....................... | 83/164 |
| 3,521,688 A | * | 7/1970 | Urschel et al. ................. | 83/165 |
| 3,555,946 A | * | 1/1971 | Addis ............................. | 83/165 |
| 3,587,804 A | * | 6/1971 | Marenco ....................... | 193/47 |
| 3,608,687 A | * | 9/1971 | Schultz et al. ................ | 193/47 |
| 3,618,435 A | * | 11/1971 | Forsberg et al. .............. | 83/165 |
| 3,635,067 A | * | 1/1972 | Hanas .......................... | 83/164 |
| 3,710,453 A | * | 1/1973 | Whelpley ..................... | 34/164 |
| 3,782,517 A | * | 1/1974 | Newcomb .................... | 193/47 |
| 3,889,563 A | * | 6/1975 | Westermann ................ | 83/165 |
| 3,916,515 A | | 11/1975 | Walsh et al. | |
| 3,935,770 A | | 2/1976 | Bareis et al. | |
| 3,970,218 A | * | 7/1976 | Lee ............................. | 198/396 |
| 4,121,514 A | * | 10/1978 | Nickaloff ...................... | 100/91 |
| 4,220,435 A | * | 9/1980 | Yeakey ........................ | 193/47 |
| 4,271,955 A | * | 6/1981 | Berube ........................ | 193/44 |
| 4,494,426 A | * | 1/1985 | Hartzell ....................... | 83/164 |
| 4,543,865 A | * | 10/1985 | Kramski ....................... | 83/164 |
| 4,607,553 A | * | 8/1986 | Hartzell ....................... | 83/164 |
| 4,683,789 A | | 8/1987 | Lopez | |
| 4,691,604 A | * | 9/1987 | Carmichael ................. | 83/164 |
| 4,915,033 A | | 4/1990 | Bond | |
| 4,977,836 A | | 12/1990 | Bond | |
| 5,035,163 A | | 7/1991 | Bakermans | |
| 5,136,907 A | * | 8/1992 | Bakermans et al. .......... | 83/164 |
| 5,450,959 A | | 9/1995 | Philippi | |
| 5,451,044 A | * | 9/1995 | Nakayama .................. | 271/189 |
| 5,467,574 A | * | 11/1995 | Thomsen ..................... | 53/255 |
| 5,628,502 A | * | 5/1997 | Amarakoon ................. | 83/167 |
| 5,794,817 A | * | 8/1998 | Rosa ........................... | 193/47 |
| 5,809,744 A | * | 9/1998 | Villines et al. ............... | 53/434 |
| 6,397,715 B1 | * | 6/2002 | Roberts ....................... | 83/164 |
| 6,523,445 B2 | * | 2/2003 | Bender ....................... | 83/164 |
| 2003/0006122 A1 | * | 1/2003 | Street et al. ................ | 198/400 |

FOREIGN PATENT DOCUMENTS

JP    5138595 A    6/1993

* cited by examiner

Primary Examiner—Allan N. Shoap
Assistant Examiner—Jason Prone

(57) ABSTRACT

The invention provides an apparatus and method for orienting a part detached from a web of parts. The apparatus and method use a duct with at least one interior sloped side to orient the part in a substantially vertical orientation. The invention further provides an apparatus for stacking a plurality of flexible circuits. The apparatus includes a container having a contoured end that causes the flexible circuits to stack upon the contoured end.

18 Claims, 4 Drawing Sheets

ORIENTING AND STACKING PARTS

BACKGROUND OF THE INVENTION

1. Technical Field

The present invention relates generally to the orienting and storing of parts, and more particularly to a method and apparatus for orienting and/or stacking parts.

2. Background Art

The manufacturing process for many small parts includes creating the parts on a web that holds many identical parts. This allows for a streamlined process in manufacturing and handling the parts in the early stages of manufacturing, thereby reducing the overall cost of manufacturing. Inn the early stages, parts can be made of a flexible material. This allows for the web to be made in a roll format, easing storage and handling of the web. After the parts are manufactured, each part must be detached from the web.

One method of detaching parts involves the use of a punch and die combination. The web of parts is aligned between the punch and die so that a single, complete part can be detached. The web material is held under tension to allow for a precise detachment of the part. The punch is then moved to strike the part and separate it from the web. Air flow may be used to assist the punch and die in separating the part from the web. If the web was previously rolled, parts made of flexible material may revert to a curled shape after being detached.

After detaching the part from the web, the part must be moved away from the punch and die combination to allow the detaching process to continue for other parts. Commonly, a detached part passes through an opening in the die. The air flow described above may further assist in moving the part through the die.

Various methods are used to further remove the newly detached parts. One method allows a detached part to fall onto a conveyor belt that carries the part away. Another method uses a chute to carry the part away from the die. Using either method, an individual often removes each part to prepare it for the next phase of manufacturing. For example, an individual may place each part in a container for shipping or storage.

Alternatively, the detached parts may be collected automatically in a container. One method provides a container placed beneath the die to collect parts after they are detached. However, when the parts are lightweight and flexible, they are subject to random changes in orientation as they fall. Additionally, depending on how a part contacts the container or previous parts, the part may not fall in a proper direction or may not come to rest in a stable position. Consequently, the parts frequently fall into the container in a disordered manner.

The disordered assortment of parts in the container creates a need for further handling of the parts in the container before they can be safely shipped or stored in the container. Additionally, the random assortment causes the parts to encompass extra space, necessitating more frequent halts to the detaching process.

As a result, there exists a need to control the orientation of a part after it has been detached from a web of parts. Additionally, there exists a need to automatically stack a plurality of parts so that they do not require further processing before shipping and/or storage.

SUMMARY OF THE INVENTION

The invention provides a method and apparatus for orienting a part. The invention further provides a method and apparatus for stacking a plurality of parts.

A first aspect of the invention provides an apparatus for orienting a part, the part having been detached from a web having a plurality of parts, the apparatus comprising: a duct including an interior sloped side, the interior sloped side creating a first opening for receiving the part and a second opening; wherein the part exits the second opening in a substantially vertical orientation.

A second aspect of the invention provides a method of orienting a part, the part having been detached from a web having a plurality of parts, the method comprising the steps of: passing the part through a duct, the duct having an interior sloped side; and orienting the part to a substantially vertical orientation using the interior sloped side.

A third aspect of the invention provides an apparatus for stacking a plurality of flexible circuits, the apparatus comprising: a container for stacking the flexible circuits, the container including an open end and a contoured end; wherein a relationship between a center of mass of a flexible circuit and a contact point of the flexible circuit with the contoured end creates a moment causing the flexible circuits to stack upon the contoured end.

The exemplary aspects of the present invention are designed to solve the problems herein described and other problems not discussed, which are discoverable by a skilled artisan.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
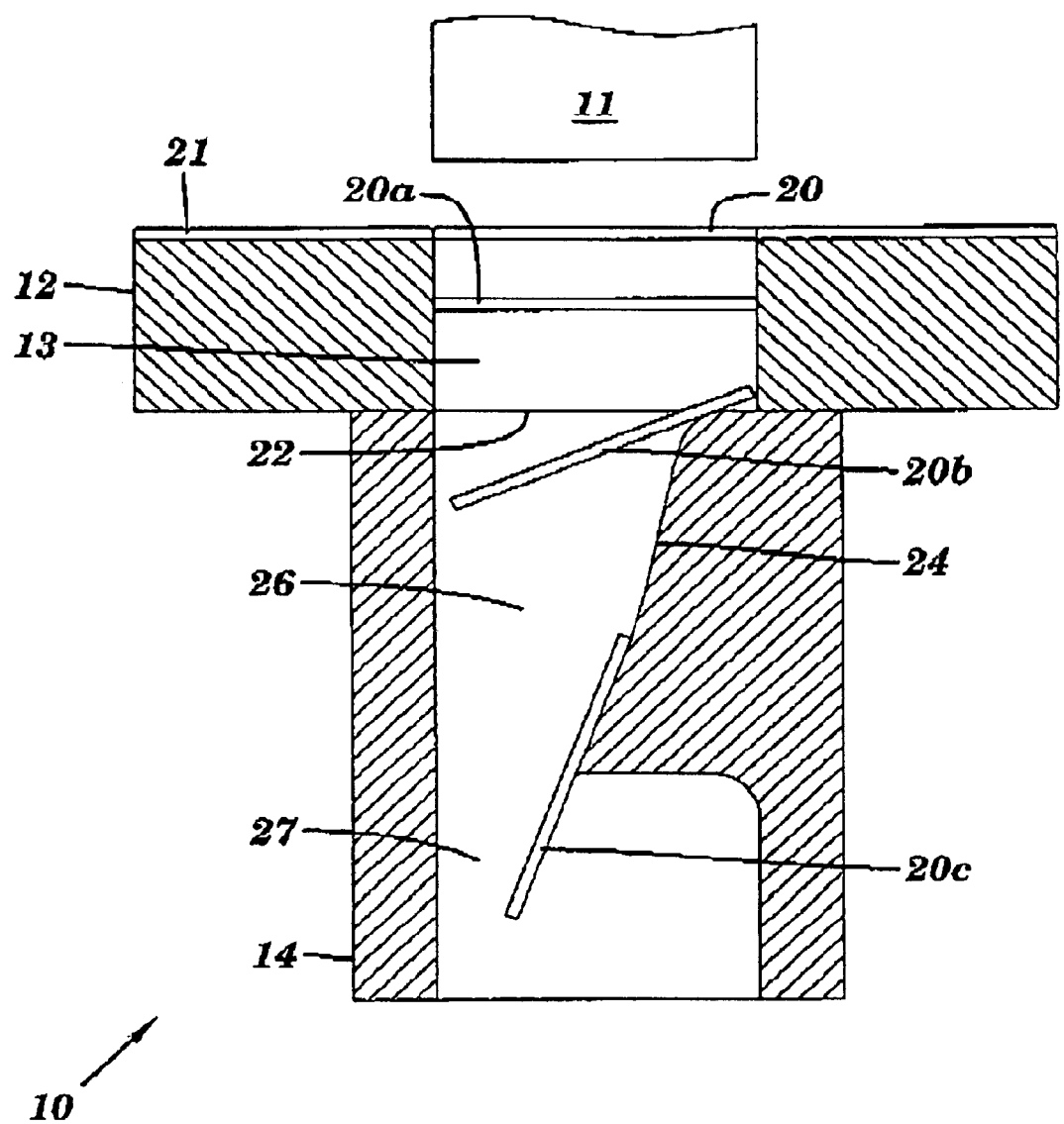
FIG. 1 is a two-dimensional cross-section of an apparatus according to one embodiment of the invention.

It is noted that the drawings of the invention are not to scale. The drawings are intended to depict only typical embodiments of the invention, and therefore should not be considered as limiting the scope of the invention. In the drawings, like numbering represents like elements between the drawings.

DETAILED DESCRIPTION OF THE INVENTION

The invention provides a method and apparatus for orienting a part. The invention also provides a method and apparatus for stacking parts.

Referring now to FIG. 1, a two-dimensional cross-section of an apparatus 10 is shown attached to a die 12. Die 12 is part of a machine that includes a punch 11. A machine including punch 11 and die 12 is commonly known in the art and operates to detach a part 20 from a web 21 having a plurality of parts. Die 12 can include an opening 13 to allow detached part 20 to pass therethrough. Punch 11 and die 12 are only exemplary of the methods for detaching parts from web 21, and the invention applies equally when other methods and machines now known or later developed are used. Other methods of detaching parts include, for example, laser cutting, water jet, etc.

Apparatus 10 is shown including a duct 14. Duct 14 can be permanently or temporarily attached to die 12 by any method now known or later developed. For example, duct 14 may be attached to die 12 by: using a u-shaped channel, molding as part of die 12, slip fitting to die 12 with a spring plunger to retain duct 14, fastening with screws, clamping, etc. Additionally, while duct 14 is shown attached to die 12, it may be attached to another part of a machine for detaching part 20 from web 21. Alternatively, duct 14 may be placed in the appropriate location without being attached to the machine. While duct 14 is shown as being narrower than die 12, it should be noted that duct 14 can be any of numerous sizes, including, for example, larger than die 12.

Duct 14 includes a first opening 22, an interior sloped side 24, a second opening 26 and a third opening 27. First opening 22 is disposed to receive part 20 after the part is detached from web 21. Interior sloped side 24 creates first opening 22, second opening 26 and third opening 27.

Figure 2:
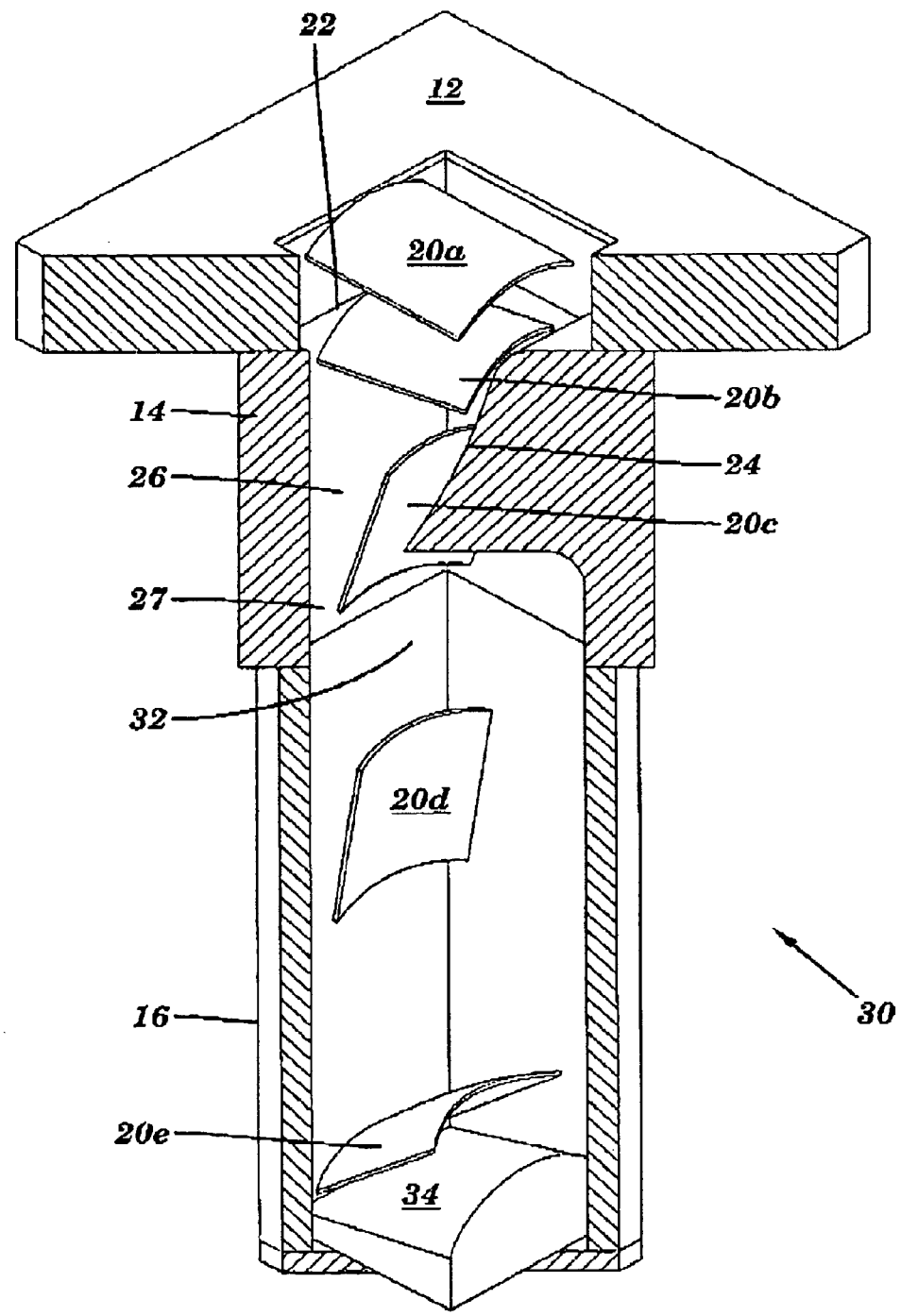
FIG. 2 is a three-dimensional cross-section of an apparatus according to one embodiment of the invention.
Figure 4:
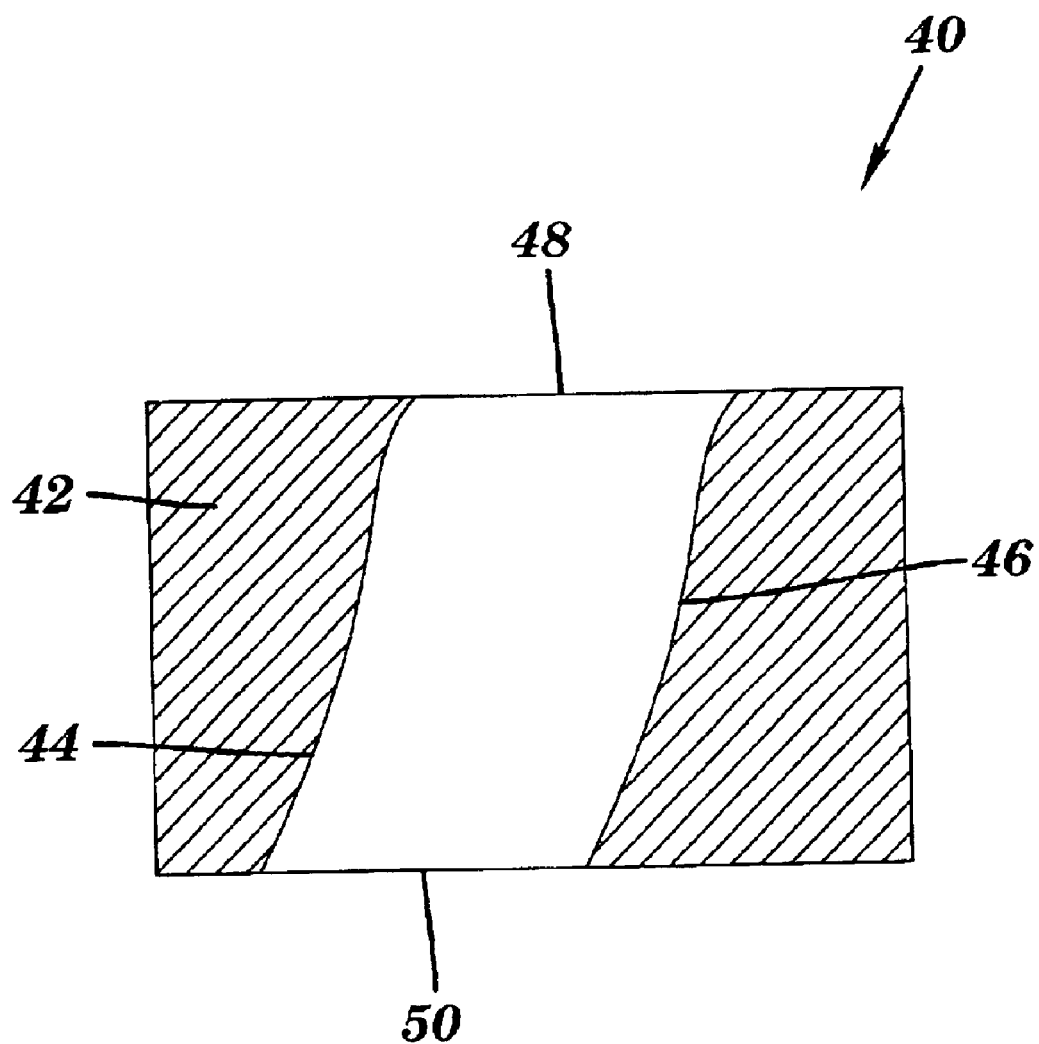
FIG. 4 is a two-dimensional cross-section of an apparatus according to one embodiment of the invention.

As shown in FIG. 1, second opening 26 of duct 14 may be smaller than first opening 22, and third opening 27 may be larger than second opening 26. However, second opening 26 may also be substantially the same size or larger than first opening 22. As shown in FIGS. 1 and 2, the first, second and third openings 22, 26, 27 are vertically aligned along at least one edge thereof (left edge as shown in FIG. 1, and back left and right edge as shown in FIG. 2). Additionally, duct 14 is shown with a single interior sloped side 24 however, a plurality of substantially parallel interior sloped sides may form first opening 22 and second opening 26. For example, FIG. 4 is a two-dimensional cross-section of an apparatus 40 including duct 42. In this embodiment, duct 42 includes multiple interior sloped sides 44, 46 that form a first opening 48 and a second opening 50 that is substantially the same size as first opening 48.

FIG. 1 also shows part 20 at various positions as it passes through the apparatus according to one embodiment of the invention. After being detached from web 21, part 20a is in a substantially horizontal position as it passes through, for example, opening 13 of die 12. Upon passing through first opening 22 of duct 14, one side of part 20b is partially obstructed by interior sloped side 24 causing part 20b to begin to orient vertically. Part 20c continues through duct 14 and along interior sloped side 24 and eventually is substantially vertically oriented as it exits through second opening 26.

Interior sloped side 24 of duct 14 can be made out of any material that allows part 20 to pass easily. For example, interior sloped side 24 may be made of polymeric material, such as polyethylene, polytetrafluoroethylene, nylon and plastic; or polished metal, etc. Interior sloped side 24 may be planar or any other shape appropriate for a particular part 20. The disposition of interior sloped side 24 may be selected based on a desired orientation of part 20. For example, one end of part 20 may weigh more than the other, therefore, interior sloped side 24 may be disposed to orient the heavier end of part 20 forward. Other methods may assist part 20 in passing through duct 14. Methods include, for example, air flow from the top of part 20, a vacuum source from the bottom, vibration, fluid, etc.

Turning to FIG. 2, a three-dimensional cross-section of an apparatus 30 is shown attached to die 12. As discussed above, a machine including a die 12 is only exemplary of machines for detaching parts from a web. The invention applies equally to other methods and machines for detaching parts from a web now known or later developed.

Figure 3:
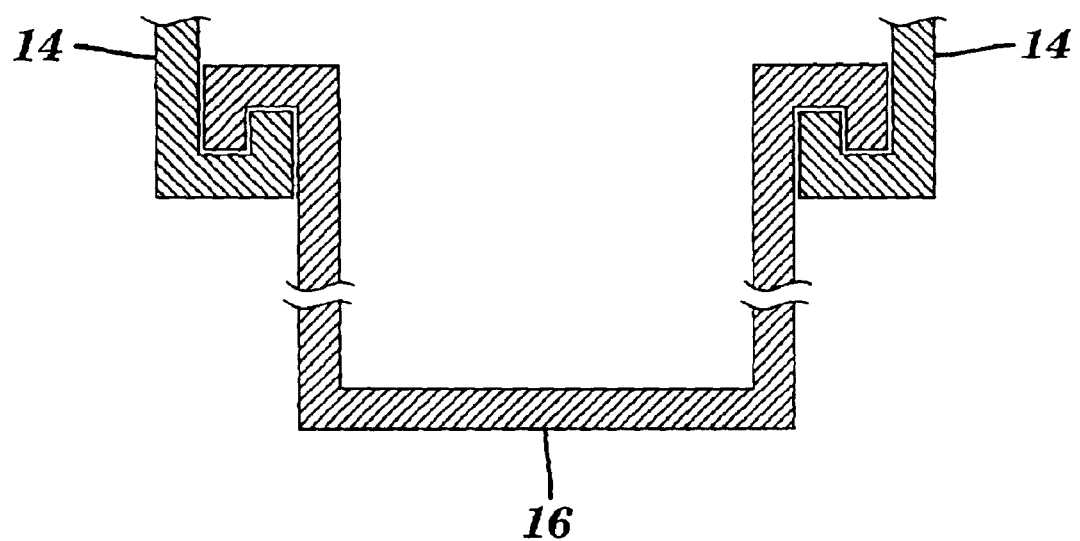
FIG. 3 is a two-dimensional cross-section of a u-shaped channel according to one embodiment of the invention.

Apparatus 30 is shown including duct 14 and a container 16. Container 16 may be attached to duct 14 to hold part 20. Container 16 can be temporarily attached to duct 14 by any method now known or later developed. For example, container 16 may be attached to duct 14 using a u-shaped channel. FIG. 3 provides a two-dimensional cross-section of one example of a u-shaped channel. Container 16 can slide onto duct 14 until it is properly in place to accept a part. A flange can be used to properly halt container 16 in the desired position.

The u-shaped channel provides one method of quickly and easily attaching container 16 to duct 14. Other methods can be used and are covered by the invention. These include, for example, slip fitting container 16 to duct 14 with a spring plunger, clamping, fastening with screws, etc. Additionally, while container 16 is shown attached to duct 14, it may be attached to another part of a machine for detaching part 20 from a web. Alternatively, container 16 may be placed in the appropriate location without being attached to the machine or duct 14.

As shown in FIG. 2, put 20 may take on a curled shape after being detached from the web. Container 16 is placed so that part 20 enters container 16 after passing through and being oriented by duct 14. Duct 14 operates in substantially the same manner as discussed in relation to FIG. 1 above. Container 16 includes an open end 32 and a convex contoured end 34. Convex contoured end 34 of container 16 substantially conforms to the curled shape of part 20.

As shown in FIG. 2, part 20 may take on a curled shape after being detached from the web. Container 16 is placed so that part 20 enters container 16 after passing through and being oriented by duct 14. Duct 14 operates in substantially the same manner as discussed in relation to FIG. 1 above. Container 16 includes an open end 32 and a contoured end 34. Contoured end 34 of container 16 substantially conforms to the curled shape of part 20.

While container 16 is shown attached to duct 14, it should be noted that either container 16 or duct 14 can be used without the other. The invention is not limited to the use of container 16 and duct 14 together. For example, duct 14 can be used to orient part 20, which is subsequently carried away by a conveyor belt. Alternatively, container 16 can be used to stack parts not oriented using duct 14.

In FIG. 2, part 20 is shown in several positions as it passes through apparatus 30. Die 12 and duct 14 operate substantially the same as stated above to orient part 20c in a substantially vertical orientation as it exits through second opening 26. Part 20d then passes through open end 32 and continues through container 16 until it contacts contoured end 34. Because contoured end 34 of container 16 substantially conforms to the curled shape of part 20e, part 20e falls forward and settles in container 16 such that the curled shape of part 20e substantially conforms to contoured end 34.

A second part, having a curled shape that substantially conforms to the curled shape of part 20, can pass into apparatus 30 after part 20. The second part is also oriented by duct 14 and passes through container 16, as discussed above. However, rather than encountering contoured end 34, the second part encounters part 20. Part 20 has settled on contoured end 34 and maintains the curled shape. Therefore, the second part contacts the curled shape of part 20 and settles similarly on part 20. This process can be repeated to stack a plurality of parts.

In the discussion above, part 20 may be any part that is detached from a web. For example, part 20 may be a flexible part or flexible circuit. The shape of contoured end 34 is such that, when a flexible circuit contacts it, the relationship between the center of mass of the flexible circuit and the contact point with the contoured end creates a moment causing the flexible circuit to stack upon the contoured end. Due to the nature of the flexible circuit, it settles and acquires substantially the same shape as contoured end 34. Therefore, each subsequent flexible circuit contacts a previous flexible circuit with substantially the same shape as contoured end 34 and stacks similarly. The flexible circuit may include plastic with metal circuitry. An adhesive may be present on one side and may be covered by an adhesive liner. It is understood, however, that the invention applies equally to parts that are not flexible or curled.

The foregoing description of various embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. An apparatus for orienting a part, the apparatus comprising:
    a machine including a punch for detaching the part from a web having a plurality of parts, and a corresponding die that include a die opening through which the detached part passes; and
    a duct including an interior sloped side and an opposing vertical edge, the interior sloped side and the opposing vertical edge creating a first opening for receiving the part, a second opening that is smaller than the first opening, and a third opening that is larger than the second opening;
    wherein the interiors sloped side partially obstructs a first longitudinal side of the part while allowing a second longitudinal side of the part to pass through the second opening unobstructed so that the part exits the third opening in a substantially vertical orientation.

2. The apparatus of claim 1, wherein the duct is coupled to the machine.

3. The apparatus of claim 1, wherein the first opening is smaller than the die opening, and wherein the interior sloped side partially obstructs a portion of the die opening.

4. The apparatus of claim 1, wherein the interior sloped side is made of one of the group consisting of polymeric material and polished metal.

5. The apparatus claim 1, wherein the interior sloped side is planar.

6. The apparatus of claim 1, wherein the part has a curled shape, the apparatus further comprising:
    a container for holding the part, the container including an open end and a convex contoured end;
    wherein the open end of the container is coupled to the duct to receive the part from the third opening of the duct; and
    wherein the convex contoured end of the container substantially conforms to the curled shape of the part.

7. The apparatus of claim 6, wherein the container accommodates a plurality of parts with a curled shape stacked upon each other.

8. The apparatus of claim 6, wherein the container is coupled to the duct using a u-shaped channel.

9. An apparatus for orienting a part having a curled shape comprising a punch for detaching the part from a web having a plurality of parts; a corresponding die that includes a die opening through which the detached part passes; and
    a duct including:
        a first edge having an outer vertical side, an interior sloped side, and a support member there between; and
        an opposing edge, the interior sloped side and the opposing edge creating a first opening for receiving e part and a second opening,
    wherein the interior sloped side partially obstructs a first longitudinal side of the part while allowing a second longitudinal side of the part to pass through the second opening unobstructed so that the part exits the second opening in a substantially vertical orientation; and
    a container for holding the part, the container including an open end and a convex contoured end;
    wherein the open end of the container is coupled to the duct to receive the part from the second opening of the duct; and
    wherein the convex contoured end of the container substantially conforms to the curled shape of the part.

10. The apparatus of claim 9, wherein the container accommodates a plurality of parts with a curled shape stacked upon each other.

11. The apparatus of claim 9, wherein the container is coupled to the duct using a u-shaped channel.

12. An apparatus for orienting a part, the apparatus comprising:
    a punch for detaching the part from a web having a plurality of parts;
    a corresponding die having a die opening, wherein the die opening comprises a substantially rectangular vertical cross section that allows the part to pass therethrough; and
    a duct disposed below the die opening, wherein the duct comprises an interior sloped side that creates a first opening for receiving the part after the die opening and a second opening that allows the part to pass therethrough;
    wherein the interior sloped side partially obstructs a portion of the die opening, and wherein the interior sloped side partially obstructs a first longitudinal side of the part while a second longitudinal side of the part passes through the second opening unobstructed so that the part exits the second opening a substantially vertical orientation.

13. The apparatus of claim 12, wherein the duct includes a plurality of substantially parallel interior loped sides.

14. The apparatus of claim 12, wherein the second opening is smaller than the first opening.

15. The apparatus of claim 14, wherein the interior sloped side further creates a third opening that is larger than the second opening, and wherein the first, second and third openings are vertically aligned along an edge opposite the interior sloped side.

16. The apparatus of claim 12, further comprising a container disposed below and vertically aligned with the second opening for receiving and stacking a plurality of parts.

17. The apparatus of claim 16, wherein the container comprises a convex contoured end.

18. The apparatus of claim 16, wherein the container is coupled to the duct using a u-shaped channel.

* * * * *

UNITED STATES PATENT AND TRADEMARK OFFICE
CERTIFICATE OF CORRECTION

PATENT NO. : 6,968,763 B2
DATED : November 29, 2005
INVENTOR(S) : Chapin et al.

It is certified that error appears in the above-identified patent and that said Letters Patent is hereby corrected as shown below:

<u>Column 4,</u>
Line 18, take out "put" and insert -- part --.
Line 26, take out the entire paragraph.

<u>Column 6,</u>
Line 46, take out "loped" and insert -- sloped --.

Signed and Sealed this

Twenty-eighth Day of March, 2006

JON W. DUDAS
*Director of the United States Patent and Trademark Office*